(12) United States Patent
Hatsuda et al.

(10) Patent No.: US 8,022,126 B2
(45) Date of Patent: *Sep. 20, 2011

(54) ENCAPSULATING RESIN COMPOSITION AND LIGHT-EMITTING DEVICE

(75) Inventors: Kouki Hatsuda, Tochigi (JP); Hiroshi Samukawa, Tochigi (JP)

(73) Assignees: Sony Corporation, Tokyo (JP); Sony Chemical & Information Device Corporation, Tokyo (JP)

( * ) Notice: Subject to any disclaimer, the term of this patent is extended or adjusted under 35 U.S.C. 154(b) by 121 days.

This patent is subject to a terminal disclaimer.

(21) Appl. No.: 11/976,888

(22) Filed: Oct. 29, 2007

(65) Prior Publication Data

US 2008/0114100 A1    May 15, 2008

(30) Foreign Application Priority Data

Nov. 15, 2006  (JP) ................................ 2006-309635

(51) Int. Cl.
*C08K 5/00*    (2006.01)

(52) U.S. Cl. ........ 524/285; 524/287; 524/299; 524/559; 524/759; 524/776; 585/27; 428/500; 522/79

(58) Field of Classification Search .................. 524/285, 524/287, 299, 325, 558, 759, 776, 559; 585/27
See application file for complete search history.

(56) References Cited

U.S. PATENT DOCUMENTS

| | | | | |
|---|---|---|---|---|
| 3,883,488 A * | 5/1975 | Pearson et al. | .................. | 526/75 |
| 4,006,017 A * | 2/1977 | Williams et al. | ................. | 430/79 |
| 6,376,590 B2 * | 4/2002 | Kolb et al. | ..................... | 524/413 |
| 6,492,441 B2 * | 12/2002 | Hong et al. | ..................... | 524/89 |
| 6,756,420 B2 * | 6/2004 | Ogawa et al. | ................. | 522/170 |
| 7,446,159 B1 * | 11/2008 | Samukawa et al. | ........... | 526/284 |
| 2006/0105483 A1 * | 5/2006 | Leatherdale et al. | ........... | 438/26 |
| 2006/0147703 A1 * | 7/2006 | Walker et al. | ................. | 428/328 |

FOREIGN PATENT DOCUMENTS

JP    A-2004-015063    1/2004

* cited by examiner

*Primary Examiner* — Mark Eashoo
*Assistant Examiner* — Nicole M Buie-Hatcher
(74) *Attorney, Agent, or Firm* — Oliff & Berridge, PLC

(57) ABSTRACT

An encapsulating resin composition is provided, which gives a cured product having heat resistance, light resistance, and flexibility equivalent to those of silicone resins and having a refractive index of 1.57 or greater which is larger than that of epoxy resins. The encapsulating resin composition contains: a high refractive index acrylic-based or methacrylic-based monomer having a refractive index of 1.55 or greater; and a nonfunctional fluorene compound. In a preferred form, each of the high refractive index acrylic-based or methacrylic-based monomer and the nonfunctional fluorene compound has a 9,9-bisphenylfluorene skeleton.

9 Claims, No Drawings

ENCAPSULATING RESIN COMPOSITION AND LIGHT-EMITTING DEVICE

BACKGROUND OF THE INVENTION

1. Field of the Invention

The present invention relates to a resin composition for encapsulating light-emitting devices and to a light-emitting device module encapsulated with the resin composition.

2. Description of the Related Art

Light-emitting devices such as LEDs (Light-Emitting Diodes) have low power consumption, are small in size, and are lightweight, and light-emitting devices encapsulated with resin are used in various types of lamps. In recent years, both blue and white LEDs have been developed, and the luminance of LEDs has also increased. Accordingly, the applications of LEDs have been rapidly expanding and include forming a backlight light source for liquid crystal display panels, forming a light source for illumination, and forming signal lamps. Furthermore, the application of LEDs to the headlamps of automobiles is also being developed.

Traditionally, bisphenol A glycidyl ether type epoxy resins are used as an encapsulating resin for light-emitting devices such as LEDs. However, with the increase in luminance of LEDs, both the heat resistance and light resistance (particularly with regard to resistance to both UV and blue light) of such epoxy resins have become insufficient. Therefore, in high-intensity LEDs, UV LEDs, and the like, the encapsulating resin thereof is discolored by the heat or UV light emitted by these LEDs, and this causes a problem in that the luminance of LED modules reduces over time. In order to resolve this problem, highly transparent epoxy resins of improved type and the like have been developed. However, the heat resistance and light resistance of such resins are still not satisfactory. In addition to this, since epoxy resins become hard once cured, a problem arises in that thermal stress may, for example, cause breakages in the wiring or peeling at the junction between an electrode and the wiring in LED modules.

In view of the above, gel-type silicone resins have recently been used in high-intensity type LEDs as they exhibit excellent heat resistance and light resistance, and also exhibit excellent physical flexibility. However, the gel-type silicone resins are two-part type curable resins in which the hydrosilylation reaction is utilized, and hence the gel-type silicone resins have to be used within their pot-life after mixing.

Moreover, since the refractive index of the gel-type silicone resins is lower than that of epoxy resins, the silicone resins have a drawback in that they reduce the light extraction efficiency of the LED modules that include these resins. Specifically, in the most common types of high intensity LED modules, an LED chip is placed face down on a sapphire substrate having a high refractive index (being 1.76), and light is extracted from the sapphire substrate side of the LED module. In order to extract light from the sapphire substrate into an encapsulating resin efficiently, it is preferable that the refractive index of the encapsulating resin be close to the refractive index of sapphire, i.e. 1.76. However, among the various silicone resins used as an encapsulating resin, dimethyl silicone resin has a refractive index of 1.41. In addition to this, diphenyl dimethyl-based and phenyl methyl-based silicone resins, into which a phenyl group is introduced to increase the refractive index thereof, only have a refractive index of approximately 1.51. When an excessively large number of phenyl groups are introduced to a silicone resin in order to increase its refractive index, the viscosity increases too much and the silicon resin therefore becomes unsuitable for pouring into a mold, and the physical flexibility of the cured product of the resultant resin is therefore impaired. Hence, the refractive index of silicone resins used as an encapsulating resin is lower than that of epoxy resins, which have a refractive index in the range of 1.53 to 1.57. Therefore, at present, while silicone resins are used, there is a compromise made with regard to light extraction efficiency in order to still take advantage of their excellent heat resistance, light resistance, and physical flexibility.

Meanwhile, there is an attempt to increase the refractive index of a resin as a whole by adding fine particles having a high refractive index to the resin (see Japanese Patent Application Laid-Open No. 2004-15063). In this case, titanium oxide, zirconium oxide, zinc oxide, and the like are considered to be used as the high refractive index fine particles. However, in order to increase the refractive index of the silicone resins to a desired level using this technique, a relatively high volume percent of, i.e., at least 10 to 40% by volume of the fine particles must be mixed into the silicone resin being used. At such a high mixing ratio, high transparency cannot be obtained, and furthermore, appropriate fluidity cannot be obtained at the time of pouring the silicone resin into a mold. Hence, there has been an attempt to improve the transparency of silicone resins using fine particles called single-nano size particles. However, as the cohesive force of the ultrafine particles of single-nano size is very strong, it is very difficult to uniformly disperse the ultrafine particles within a resin without forming secondary aggregated particles. Therefore, a technology for increasing the refractive index by adding such fine particles has not yet been practically realized. Accordingly, in high-intensity LED modules, a gel-type silicone resin alone is still often used even though the refractive index is compromised.

SUMMARY OF THE INVENTION

In view of the problems associated with the above-detailed conventional technology, it is an object of the present invention to provide an encapsulating resin composition which gives a cured product having heat resistance, light resistance, and physical flexibility equivalent to those of silicone resins, and having a refractive index of 1.57 or greater, which is greater than that of epoxy resins. It is also an object of the present invention to provide a light-emitting device module encapsulated with the encapsulating resin composition.

Acrylic-based or methacrylic-based monomers (hereinafter referred to as (meth)acrylic-based monomers) include monomers which give a cured product with a high refractive index of 1.55 or greater and excellent heat resistance and light resistance, but the cured product lacks physical flexibility. However, the present inventors have found that the above object of the present invention can be achieved by a mixture of a (meth)acrylic-based monomer and a nonfunctional fluorene compound which is not polymerized along with the (meth)acrylic-based monomer. Specifically, in this case, the cured product of the mixture is gel-like, so that the physical flexibility thereof is improved. Therefore, the aim of the present invention has been achieved.

Accordingly, the present invention provides an encapsulating resin composition comprising a high-refractive index (meth)acrylic-based monomer having a refractive index of 1.55 or greater and a nonfunctional fluorene compound.

In particular, in one embodiment of the present invention, each of the high-refractive index (meth)acrylic-based monomer and the nonfunctional fluorene compound has a 9,9-bisphenylfluorene skeleton. In addition to this, a method for manufacturing the encapsulating resin composition is provided, with the method comprising esterifying a 9,9-bisphenolfluorene compound having a hydroxy group sequentially or simultaneously with acrylic or methacrylic acid and a saturated fatty acid to form a mixture of a multifunctional acrylate, a monofunctional acrylate, and a nonfunctional compound of the 9,9-bisphenolfluorene compound, with the mixture being used as a raw material of the encapsulating resin composition.

Moreover, the present invention provides a cured product of the encapsulating resin composition and a light-emitting device encapsulated with the encapsulating resin composition.

According to the encapsulating resin composition of the present invention, the refractive index of the cured product thereof can be adjusted to 1.57 or greater without the addition of high-refractive index ultrafine particles such as titania. Hence, a cured product can be provided which has a refractive index that is higher than that of both conventional epoxy resins and silicone resins and which exhibits excellent transparency. Moreover, this cured product has a low Shore A hardness of 90 or less and has both physical flexibility and thermal stress relaxation properties. Hence, light-emitting device modules such as LED modules using the cured product of this encapsulating resin composition are not subject to thermal stress. Therefore, problems, such as the deterioration of light-emitting device modules and breakage in wiring caused by heat, can be reduced.

Moreover, the resin composition of the present invention is not a two-part type resin composition, and therefore there is no limitation on the pot life of such. Furthermore, the resin composition of the present invention is easily cured by application of heat or UV light thereto and is therefore easy to use.

According to the encapsulating resin-manufacturing method of the present invention, the resin composition of one embodiment of the present invention, in which each of an acrylic-based or methacrylic-based monomer and a nonfunctional fluorene compound has a 9,9-bisphenylfluorene skeleton, can be manufactured economically and simply.

Moreover, according to the light-emitting device module of the present invention, the light extraction efficiency of the light-emitting device can be improved as the encapsulating resin has a high refractive index and exhibits excellent transparency.

DETAILED DESCRIPTION OF THE PREFERRED EMBODIMENTS

Hereinafter, the present invention will be described in detail.

An encapsulating resin composition of the present invention contains a high-refractive index (meth)acrylic-based monomer and a nonfunctional fluorene compound. The refractive index of the (meth)acrylic-based monomer strongly affects the refractive index of the cured product of the encapsulating resin composition. Therefore, in the present invention, a high-refractive index (meth)acrylic-based monomer having a refractive index of 1.55 or greater is used. Hence, the encapsulating resin composition of the present invention gives a cured product having a refractive index of 1.57 or greater, preferably 1.59 or greater, and normally 1.57 to 1.60.

Here, the refractive index is a value measured at the Na D line (589 nm) and at 25° C.

Examples of the high-refractive index (meth)acrylic-based monomer used in the present invention include a compound represented by formula 1:

$(A-Y)_m$—X  [Formula 1]

wherein: A is an acryloyl or methacryloyl group; X is a cumylphenyl group, a biphenyl group, a diphenylmethane group, a diphenyl ether group, a terphenyl group, a fluorene group, a carbazole group, or a group having the skeleton of a polycyclic aromatic hydrocarbon group such as a naphthalene or anthracene group; Y is —O—, —O—(CH$_2$CH$_2$O)— or —O—(CH$_2$(CH$_3$)CHO)$_n$ with n being 1 to 5 or is —O—(CH$_2$CH$_2$O)$_{n1}$—(CH$_2$ (CH$_3$)CHO)$_{n2}$— with n1+n2 being 1 to 5; and m is 1 to 6.

The high-refractive index (meth)acrylic-based monomers of formula 1 may be used alone or in combination of two or more thereof.

Among the high-refractive index (meth)acrylic-based monomers of formula 1, a fluorene group-containing (meth)acrylic-based monomer is preferred since it has a higher refractive index. As the fluorene group-containing (meth)acrylic-based monomer, either one or both of a multifunctional monomer and a monofunctional monomer may be used. As the multifunctional monomer, a (meth)acrylic-based monomer having a 9,9-bisphenylfluorene skeleton and represented by the following formula 2A or 2B is useful:

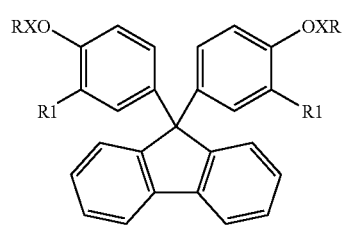

[Formula 2A]

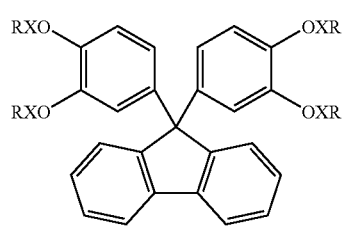

[Formula 2B]

wherein X is absent or is —(CH$_2$CH$_2$O)$_n$ or —(CH$_2$CH$_2$O)$_n$ (CH$_2$CH(OH)CH$_2$O)— with n being 1 to 5; R is an acryloyl or methacryloyl group, provided that in formula 2B up to two of R at any position may be a saturated fatty acid residue; and R1 is a hydrogen atom or a methyl group.

A commercially available product may be used as the fluorene group-containing (meth)acrylic-based monomer. For example, there may be used 9,9-bis(4-(2-acryloylethoxy)phenyl)fluorene (Osaka Gas Chemicals Co., Ltd., BPEF-A, refractive index before curing: 1.614) represented by the following formula 2C.

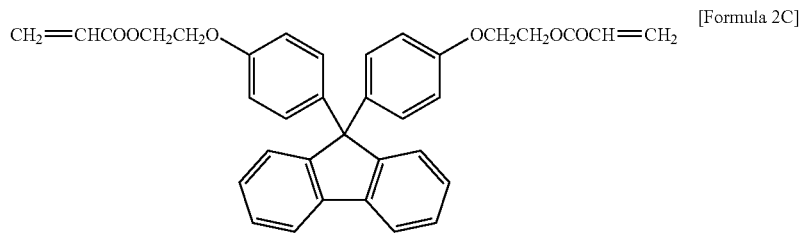

[Formula 2C]

Furthermore, as the monofunctional monomer used as the fluorene group-containing (meth)acrylic-based monomer, a monomer in which three of R in the above formula 2B at any position are substituted with a saturated fatty acid residue may be used. Moreover, the compound represented by the following formula 3 is useful:

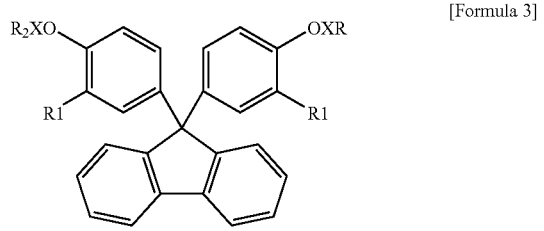

[Formula 3]

wherein X is absent or is —(CH$_2$CH$_2$O)$_n$ or —(CH$_2$CH$_2$O)$_n$(CH$_2$CH(OH)CH$_2$O)— with n being 1 to 5; R is an acryloyl or methacryloyl group; R1 is a hydrogen atom or a methyl group; and R2 is a saturated fatty acid residue having 2 to 5 carbon atoms.

Such a monofunctional monomer may be obtained as follows. As shown in an esterification scheme below, a phenol having a corresponding 9,9-bisphenylfluorene skeleton or an alkylene oxide adduct thereof is used as a raw compound (formula 4A). Then, the raw compound is esterified with an equimolar amount of (meth)acrylic acid and an equimolar amount of a saturated fatty acid under the presence of an acid catalyst. During the esterification reaction, the raw compound may be reacted sequentially or simultaneously with the (meth)acrylic acid and the saturated fatty acid. In this manner, the following three monomers are formed: a bifunctional monomer (formula 4B) in which an OH group at each of two terminals of the raw compound (formula 4A) is substituted with a (meth)acryloyl group; a monofunctional monomer (formula 4C) in which one of the two terminal groups is a (meth)acryloyl group and the other terminal group is a saturated fatty acid residue; and a nonfunctional compound (formula 4D) in which both the terminal groups are a saturated fatty acid residue. The generation ratio of these three types is stochastically determined according to the rates of the respective reactions. Assuming that the rates of the respective reactions are substantially the same, the generation ratio of the compounds of formulas 4B, 4C, and 4D is 1:2:1.

The mixture of the three monomers may be used after the three monomers are separated and purified in accordance with need, or the mixture as it is may be used as a raw monomer or a raw compound for the encapsulating resin composition of the present invention. Therefore, a method for economically advantageously manufacturing the encapsulating resin composition of the present invention is as follows. The raw compound (formula 4A) is reacted simultaneously or sequentially with (meth)acrylic acid and a saturated fatty acid to obtain a mixture of the bifunctional monomer (formula 4B), the monofunctional monomer (formula 4C), and the nonfunctional compound (formula 4D). Then, the obtained mixture is used as a raw material for the encapsulating resin composition of the present invention.

Esterification Scheme

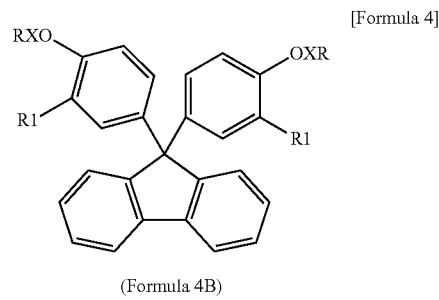

[Formula 4]

(Formula 4B)

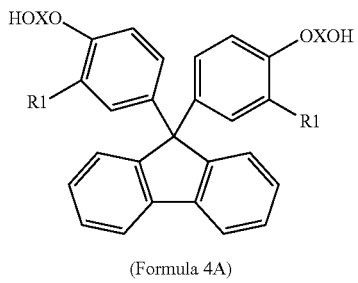

(Formula 4A)

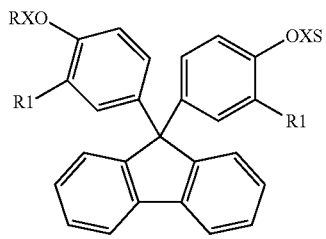

(Formula 4C)

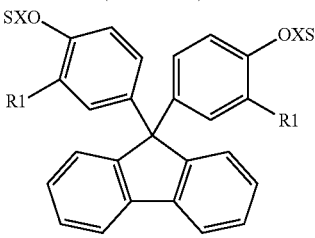

(Formula 4D)

X is absent or is ——(CH$_2$CH$_2$O), or ——(CH$_2$CH$_2$O), (CH$_2$CH(OH)CH$_2$O)—— with n being 1 to 5.
R is an acryloyl or methacryloyl group.
R1 is a hydrogen atom or a methy group.
S is a saturated fatty acid residue.

Preferred examples of the high-refractive index (meth)acrylic-based monomer include, in addition to the above monomers having a fluorene skeleton: multifunctional monomers such as naphthalene di(meth)acrylate and anthracene di(meth)acrylate; and monofunctional monomers such as N-vinylcarbazole, N-ethoxyacryloylcarbazole, paracumylphenoxy acrylate represented by formula 5, and orthophenylphenol ethylene oxide-modified acrylate represented by formula 6. Commercially available products of the high-refractive index (meth)acrylic-based monomer include: paracumylphenoxy acrylate (formula 5, product of TOAGOSEI CO., LTD., product name: ARONIX M110, refractive index of monomer: 1.564, viscosity: 125 mPa·s), orthophenylphenol ethylene oxide-modified acrylate (formula 6, product of TOAGOSEI CO., LTD., product name: TO1463, refractive index of monomer: 1.5785, viscosity: 125 mPa·s), and the like.

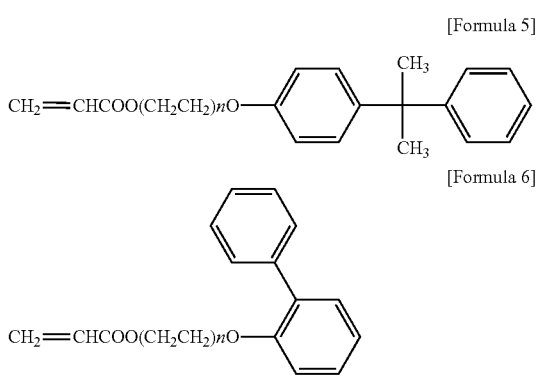

[Formula 5]

[Formula 6]

In general, the cured product of the high-refractive index (meth)acrylic-based monomers is hard. Some degree of physical flexibility can be imparted to the cured product by increasing the addition mole number (n) of ethylene oxide represented by Y in formula 1. However, when the addition mole number (n) is increased, the refractive index decreases accordingly. Therefore, it is difficult to obtain the desired physical flexibility and desired refractive index at the same time. Hence, in the present invention, a nonfunctional fluorene compound is also mixed into the resin compound, whereby the desired physical flexibility and desired refractive index are obtained at the same time.

In the present invention the nonfunctional fluorene compound is a fluorene compound which does not react with the (meth)acrylic-based monomer. Hence, the nonfunctional fluorene compound is not incorporated into the polymer network of the (meth)acrylic-based monomer and instead serves as a medium for the (meth)acrylic-based monomer network. Therefore, the cured product of the encapsulating resin composition of the present invention containing the (meth)acrylic-based monomer and the nonfunctional fluorene compound is gel-like and exhibits improved physical flexibility.

Furthermore, the refractive index of the nonfunctional fluorene compound is high. In the encapsulating resin composition of the present invention, the nonfunctional fluorene compound is mixed with the (meth)acrylic-based monomer. Therefore, the refractive index of the cured product of the encapsulating resin composition can be increased to a high value in the range of 1.57 to 1.60.

Preferably, the nonfunctional fluorene compound is nonvolatile, has good compatibility with the (meth)acrylic-based monomer and has a refractive index of 1.6 or greater.

Examples of the preferred nonfunctional fluorene compound include compounds represented by the formula 4D in the above-described scheme. Among such compounds, the fatty acid esters of bisphenol fluorenes in which a group in the 4-position is an —OH group or an ethylene oxide adduct thereof are particularly preferred.

Each of these fatty acid esters of bisphenol fluorenes can be easily synthesized through the dehydration esterification reaction of a corresponding bisphenol fluorene or an ethylene oxide adduct thereof and the like with a saturated fatty acid in the presence an acid catalyst. Alternatively, a corresponding saturated fatty acid chloride may be used in place of the saturated fatty acid.

Specific examples of the bisphenol fluorenes and the ethylene oxide adducts thereof include 9,9-bis(4-hydroxyphenyl)fluorene, 9,9-bis(3-fluoro-4-hydroxyphenyl)fluorene, 9,9-bis(3-methyl-4-hydroxyphenyl)fluorene, and 9,9-bis(4-(2-hydroxyethoxy)phenyl)fluorene.

Furthermore, specific preferred examples of the saturated fatty acid include saturated lower fatty acids having a total number of carbon atoms of 1 to 8, such as formic acid, acetic acid, propionic acid, isobutyric acid, butyric acid, isovaleric acid, valeric acid, caproic acid, isocaproic acid, enanthic acid, and caprylic acid. The refractive index is reduced when the total number of carbon atoms of the saturated fatty acids exceeds 8, which is not preferable.

If necessary, a diluting monomer may be added to the encapsulating resin composition of the present invention in order to adjust the viscosity of such. The diluting monomer preferably has a viscosity of 1000 mPa·s or less, and more preferably, 200 mPa·s or less. Specifically, the viscosity of the encapsulating resin composition can be reduced to a certain extent by selecting a high-refractive index (meth)acrylic-based monomer having a low viscosity. However, most high-refractive index (meth)acrylic-based monomers are highly viscous liquids (viscosity: one million mPa·s or more) or form a solid at room temperature. Only the monomers represented by formulas 5 and 6 and the like have a viscosity that is suitable for use in an encapsulating material (300 thousand mPa·s or less). Therefore, a diluting monomer may be added to the encapsulating resin composition of the present invention, in accordance with need, in order to adjust the viscosity to a value that is suitable for use as an encapsulating material.

A low refractive index monomer having a refractive index of less than 1.55 may also be added as the diluting monomer so long as the refractive index of the cured product is greater than or equal to a predetermined value, i.e., 1.57 or greater. However, the mixing amount of such a monomer is preferably less than 30% by weight.

One of a multifunctional monomer and a monofunctional monomer or a mixture thereof may be used as the diluting monomer.

Representative examples of the multifunctional diluting monomer include: diacrylates or dimethacrylates of alkylene diols such as ethylene glycol, diethylene glycol, triethylene glycol, propylene glycol, dipropylene glycol, tripropylene glycol, butanediol, neopentyl glycol, and hexanediole; diacrylates of an EO adduct of bisphenol A; diacrylates of a PO adduct of bisphenol A; trimethylolpropane tri(meth)acrylate; EO-modified trimethylolpropane tri(meth)acrylate; PO-modified trimethylolpropane tri(meth)acrylate; EO or PO-modified trimethylolpropane tri(meth)acrylate; pentaerythritol tri(meth)acrylate; pentaerythritol tetra(meth)acrylate; dipentaerythritol hexa(meth)acrylate; and divinylbenzene.

Representative examples of the monofunctional diluting monomer include: styrene; and acrylates and methacrylates such as phenol EO-modified acrylate and methacrylate (EO addition mole number: 1 to 5), phenol PO-modified acrylate and methacrylate (PO addition mole number: 1 to 5), methylphenyl EO-modified acrylate and methacrylate (EO addition mole number: 1 to 5), methylphenyl PO modified acrylate and methacrylate (PO addition mole number: 1 to 5), nonylphenyl EO modified acrylate and methacrylate (EO addition mole number: 1 to 5), nonylphenyl PO modified acrylate and methacrylate (PO addition mole number: 1 to 5), 2-hydroxy-3-phenoxypropyl acrylate and methacrylate. Of these, monomers having a phenyl group in their molecules are preferred since they have a high refractive index.

A preferred mixing ratio of the amount of the high-refractive index (meth)acrylic-based monomers including the diluting monomer added in accordance with need is 3 to 90% by weight with respect to the total amount of the high-refractive index (meth)acrylic-based monomers, the nonfunctional fluorene compound, and the diluting monomer. A preferred mixing ratio of the nonfunctional fluorene compound is 10 to 97% by weight. However, the mixing ratio of the diluting monomer is preferably 30% by weight or less.

Preferably, 3 to 50% by weight of the (meth)acrylic-based monomers including the diluting monomer is multifunctional monomers. The amount of the multifunctional monomers exceeding 50% by weight is not preferred because sufficient physical flexibility cannot be imparted to the cured product. Moreover, the amount of the multifunctional monomers less than 3% by weight is not preferred because the cured product flows at high temperatures. Furthermore, only one of the high-refractive index (meth)acrylic-based monomer and the diluting monomer may be a multifunctional monomer, or both may be a multifunctional monomer.

No particular limitation is imposed on the number of functional groups included in the multifunctional monomer, and the number may be between 2 and 6. Normally, in terms of physical flexibility, however, it is preferable to use a bifunctional monomer as the main component and use trifunctional or higher functionality monomers in an auxiliary manner.

In order to further increase the refractive index of the cured product of the encapsulating resin composition of the present invention, the encapsulating resin composition may contain high-refractive index ultra-fine particles. Preferably, the high-refractive index ultra-fine particles are transparent ultrafine particles having a refractive index of 1.6 or greater, and a dispersion in which such particles are dispersed may also be preferably used. Examples of the high-refractive index ultra-fine particles include ultrafine particles of metal oxides such as titanium oxide, zirconium oxide, zinc oxide, aluminum oxide, and magnesium oxide.

Preferably, the surface of the ultrafine particles is subjected to hydrophobic treatment. In this manner, the dispersion properties of the ultrafine particles in the encapsulating resin composition of the present invention can be improved.

The smaller the diameter of the ultrafine particles, the higher the transparency and the more the Rayleigh scattering is suppressed. Therefore, the average diameter of the ultrafine particles is 20 nm or less, and preferably 9 nm or less (single-nano size).

Preferably, the amount of the ultrafine particles used is 20 parts by volume or less per 100 parts by volume of the encapsulating resin composition of the present invention.

The encapsulating resin composition of the present invention may contain various additives such as a polymerization initiator, a polymerization inhibitor, a filler, and a light stabilizer in accordance with need.

When the encapsulating resin composition of the present invention contains a multifunctional monomer having a fluorene skeleton in an amount of 10% by weight or more, the encapsulating resin composition can be thermally polymerized without the addition of a polymerizing initiator. However, when the encapsulating resin composition needs to be cured quickly, or needs to be cured by the application of UV light, a polymerization initiator must be used. In such a case, commercially available radical curing agents such as peroxides or azo compounds, UV curing agents, and the like may be used as the polymerization initiator. The amount of the polymerization initiator to be mixed is preferably in the range of 0.1 to 5 parts by weight, and more preferably in the range of 0.3 parts to 1 part by weight with respect to the total amount of the resin composition (100 parts by weight).

For example, approximately 25 to 1000 ppm of hydroquinone, methoquinone, BHT, or the like may be added to the resin composition as a polymerization inhibitor.

Furthermore, silicon oxide fine particles in the form of an aerosol may be added to the resin composition as a thixotropy-imparting filler. Moreover, in order to convert the wavelength of the light emitted from an LED, a coloring dye, a YAG phosphor, or the like may be added to the resin composition as fillers. The mixing amount of the filler used is preferably 20 parts by weight or less with respect to the total amount of the encapsulating resin composition (100 parts by weight).

The encapsulating resin composition of the present invention can be obtained as a liquid composition by mixing and stirring the high-refractive index (meth)acrylic-based monomer, the nonfunctional fluorene compound, and, if necessary, the diluting monomer, the high-refractive index ultrafine particles, and other various additives by means of a routine method and uniformly dispersing the components throughout the resin composition. A mixture of a multifunctional monomer, a monofunctional monomer, and a nonfunctional compound can be obtained through the above-described esterification scheme. It is particularly advantageous to use this mixture as the preferred mixture of the high-refractive index (meth)acrylic-based multifunctional and monofunctional monomers and the nonfunctional fluorene compound of the present invention.

This encapsulating resin composition can be cured by heating it to a temperature of 80 to 150° C., or by applying UV light. The encapsulating resin composition of the present invention can be used as an optical curable resin composition that is suitable for encapsulating LEDs, optical discs, and light-emitting devices such as lasers. Therefore, the present invention includes both the cured product of the encapsulating resin composition of the present invention and light-emitting devices encapsulated with the cured product. The encapsulated light-emitting devices include not only devices having an encapsulated bare chip, but also light-emitting device modules in which the substrate and wiring thereof are also encapsulated.

EXAMPLES

The present invention will now specifically described by way of Examples. In the following Examples, the viscosity, refractive index, cut-off wavelength, heat resistance, Shore-A hardness, and light resistance were determined as follows.

Viscosity: The viscosity was measured at 25° C. by means of an E-type viscometer.

Refractive index: The refractive index was measured by means of an Abbe refractometer (Na D line (585 nm), 25° C.). For a sheet of the above-described cured product, a matching oil was used when performing the refractive index measurement.

Cut-off wavelength: A transmission spectrum was measured to determine the cut-off wavelength. It should be noted that it is necessary, in practical terms, that the cut-off wavelength be sufficiently lower than 440±20 nm, which is the wavelength of the light emitted from a blue LED.

Heat resistance: A sheet of the above-described cured product was used as a test piece, and a heat resistance test was performed by leaving the test piece to stand in air at 150° C. for 96 hours and the change in transparency before and after the test was visually observed.

Shore-A hardness: The Shore-A hardness (at room temperature) of the sheet of the above-described cured product was measured according to ASTM D2240 by means of a type-A durometer.

Resistance to light (including UV light): Light from a UV Spot-Cure (USHIO Inc.) was applied to the above-described cured product for 10 hours (120 mW/cm$^2$).

Resistance to light (not including UV light): Light from a UV Spot-Cure (USHIO Inc.) through a UV-cut filter (which shields light having a wavelength of 350 nm or less) was applied to the above-described cured product for 10 hours (200 mW/cm$^2$).

Example 1

(1) Synthesis of the Nonfunctional Fluorene Compound 87.7 g (0.2 moles) of 9,9-bis(4-(2-hydroxyethoxy)phenyl)fluorene (product of JFE Chemical Corporation, product name: BPEF) and 32.6 g (0.44 moles) of propionic acid were dissolved in 250 mL of toluene. The mixture was charged into a 1 L glass reaction vessel equipped with a cooling tube, an agitator, and a thermometer. While nitrogen gas was fed into the reaction vessel, the mixture was externally heated to 100° C. using an oil bath. 0.8 mL of concentrated sulfuric acid was added to the mixture to initiate the esterification reaction. Water produced by the reaction was continuously discharged to outside the system through its azeotrope with toluene. After 5 hours, the substantial completion of the reaction was confirmed through FT-IR. Next, the temperature was increased to 115° C., and the reaction was continued for another one hour. At this point, no further discharge of water produced by the reaction was observed, and only toluene was distilled off. Therefore, the reaction was terminated.

The reaction product was neutralized with anhydrous sodium carbonate and washed with saturated saline several times. Subsequently, the reaction product was dehydrated and filtrated through a column filled with anhydrous sodium sulfate. The obtained toluene solution was precipitated out in n-hexane, and the precipitate was filtrated and dried, whereby the target compound, being 9,9-bis(4-(2-propionoylethoxy)phenyl)fluorene, was obtained. This reaction product was a white powder having a melting point of 100° C. In addition to this, it was confirmed by FT-IR and liquid chromatography that the reaction product was a nonfunctional fluorene compound that did not contain an acryloyl group. The refractive index was measured and found to be 1.6073.

(2) Manufacturing of the Encapsulating Resin Composition and a Sheet of the Cured Product Thereof 10 parts by weight of 9,9-bis(4-(2-acryloylethoxy)phenyl)fluorene (product of Osaka Gas Chemicals Co., Ltd., product name: BPEF-A, refractive index: 1.6145) serving as the high-refractive index (meth)acrylic-based multifunctional monomer was mixed with 30 parts by weight of paracumylphenoxy acrylate (product of TOAGOSEI CO., LTD., product name: ARONIX M110, refractive index: 1.5542) serving as the high-refractive index (meth)acrylic-based monofunctional monomer and 60 parts by weight of 9,9-bis(4-(2-propionoylethoxy)phenyl)fluorene obtained as the nonfunctional fluorene compound obtained in (1). Furthermore, 1 part by weight of a photoinitiator (product of Ciba Specialty Chemicals, D-1173) was added to the mixture, whereby an encapsulating resin of this Example was obtained. Further to this, the encapsulating resin composition was irradiated with UV light while being sandwiched between PET films, to thereby obtain a sheet of the cured product having a thickness of 0.5 mm.

Example 2

The same procedure as in Example 1 was repeated except that, as the high-refractive index (meth)acrylic-based monofunctional monomer, 2-(2-acryloyloxyethoxy)biphenyl (product of TOAGOSEI CO., LTD., product name TO-1463, refractive index: 1.5785) was used in place of paracumylphenoxy acrylate, to thereby prepare an encapsulating resin composition and a sheet of the cured product thereof.

Example 3

The same procedure as in Example 1 was repeated except that, as the high-refractive index (meth)acrylic-based monofunctional monomer, 30 g of 2-(2-acryloyloxyethoxy)biphenyl (product of TOAGOSEI CO., LTD., product name TO-1463, refractive index: 1.5785) was used in place of paracumylphenoxy acrylate and that 10 g of 2,2-bis(4-(acryloxydiethoxy)phenyl)propane (product of Shin-nakamura Chemical Corporation, product name: NK ester A-BPE-4, refractive index: 1.5365) serving as the diluting monomer was used, to thereby prepare an encapsulating resin composition and a sheet of the cured product thereof.

Comparative Example 1

The same procedure as in Comparative Example 1 was repeated except that the nonfunctional fluorene compound was not used and the amount of 9,9-bis(4-(2-acryloxyethoxy) phenyl)fluorene was increased correspondingly, to thereby prepare an encapsulating resin composition and a sheet of the cured product thereof.

Comparative Example 2

The same procedure as in Comparative Example 1 was repeated except that, as the high-refractive index (meth) acrylic-based monofunctional monomer, 2-(2-acryloyloxyethoxy)biphenyl (product of TOAGOSEI CO., LTD., product name: TO-14638 refractive index: 1.5785) was used in place of paracumylphenoxy acrylate, to thereby prepare an encapsulating resin composition and the cured product thereof were obtained.

Evaluation

Examples 1 to 3 and Comparative Examples 1 and 2

Each of the encapsulating resin compositions of Examples 1 to 3 and Comparative Examples 1 and 2 was measured for viscosity and refractive index. Moreover, a transmission spectrum was measured to determine the cut-off wavelength. In addition to this, the refractive index, hardness, and heat resistance of the sheet of cured product of each of the encapsulating resin compositions were measured. The results are shown in Table 1.

TABLE 1

| | Composition (parts by weight) | | | | | Evaluation | | | | |
|---|---|---|---|---|---|---|---|---|---|---|
| | High-refractive index (meth)acrylate-based monomer | | Non-functional fluorene compound | Diluting monomer | Curing agent | Viscosity (mPa·s) | Refractive index of composition | Cut-off wavelength (nm) of composition | Refractive index of cured product | Hardness (Shore-A hardness) of cured product | Heat resistance of cured product |
| | Multifunctional | Monofunctional | | | | | | | | | |
| Ex. 1 | 10 (*1) | 30 (*3) | 60 (*5) | | 1 | 150000 | 1.5863 | 325 | 1.595 | A60 | No change |
| Ex. 2 | 10 (*1) | 30 (*4) | 60 (*5) | | 1 | 150000 | 1.5994 | 325 | 1.609 | A62 | No change |
| Ex. 3 | | 30 (*4) | 60 (*5) | 10 (*2) | 1 | 135000 | 1.5919 | 325 | 1.601 | A62 | No change |
| Comp. Ex. 1 | 70 (*1) | 30 (*3) | 0 | | 1 | 41000 | 1.5964 | 325 | 1.626 | A98 | No change |
| Comp. Ex. 2 | 70 (*1) | 30 (*4) | 0 | | 1 | 38000 | 1.6037 | 325 | 1.633 | A93 | No change |

Notes:
(*1) 9,9-Bis(4-(2-acryloxyethoxy)phenyl)fluorene (product of Osaka Gas Chemicals Co., Ltd., product name: BPEF-A, refractive index: 1.6145).
(*2) 2,2-Bis(4-(acryloxydiethoxy)phenyl)propane (product of Shin-nakamura Chemical Corporation, product name: NK ester A-BPE-4, refractive index: 1.5365).
(*3) Paracumylphenoxy acrylate (product of TOAGOSEI CO., LTD., product name: ARONIX M110, refractive index: 1.5542).
(*4) 2-(2-Acryloyloxyethoxy)biphenyl (product of TOAGOSEI CO., LTD., product name: TO-1463, refractive index: 1.5785).
(*5) 9,9-Bis(4-(2-propionoylethoxy)phenyl)fluorene (synthesized in Example 1 (1), refractive index: 1.6073).

As can be seen from Table 1, in Comparative Examples 1 and 2 in which the nonfunctional fluorene compound was not used, the hardness of the cured product was high, and therefore the physical flexibility was poor. However, in Examples 1 to 3, although the refractive index of the cured product was high, i.e., 1.59 or greater, the Shore-A hardness thereof was low, and therefore the physical flexibility was excellent. Moreover, the transparency of the cured product was excellent as in the cured product of Comparative Examples 1 and 2.

Example 4

(1) Synthesis (A) of Mixture of Multifunctional, Monofunctional, and Nonfunctional Fluorene Compounds 87.7 g (0.2 moles) of 9,9-bis(4-(2-hydroxyethoxy)phenyl) fluorene (product of JFE Chemical Corporation, product name: BPFE), 8.15 g (0.11 moles) of propionic acid, 7.93 g (0.11 moles) of acrylic acid, and 0.1 g of methoquinone was dissolved in 250 mL of toluene. The mixture was charged into a 1 L glass reaction vessel equipped with a cooling tube, an agitator, and a thermometer. While nitrogen gas was fed into the reaction vessel, the mixture was externally heated to 100° C. using an oil bath. 0.8 mL of concentrated sulfuric acid was added to the mixture to initiate the esterification reaction. Water produced by the reaction was continuously discharged to outside the system through its azeotrope with toluene. After 5 hours, the substantial completion of the reaction was confirmed through FT-IR. Next, the temperature was increased to 115° C., and the reaction was continued for another one hour. At this point, no further discharge of water produced by the reaction was observed, and only toluene was distilled off. Therefore, the reaction was terminated. The reaction product was neutralized with anhydrous sodium carbonate and washed with saturated saline several times. Subsequently, the reaction product was dehydrated and filtrated through a column filled with anhydrous sodium sulfate. The obtained toluene solution was precipitated out in n-hexane, and the precipitate was filtrated and dried, whereby the target mixture of 9,9-bis(4-(2-acryloxyethoxy)phenyl)fluorene, 9-(4-(2-propionoylethoxy)phenyl)-9-(4-(2-acryloxyethoxy)phenyl)fluorene, and 9,9-bis(4-(2-propionoylethoxy)phenyl)fluorene was obtained. The mixture was a white powder. It was found through FT-IR and liquid chromatography that the ratio of the bifunctional compound:the monofunctional compound:the nonfunctional compound in the mixture was 1:2:1.

(2) Manufacturing of the Encapsulating Resin Composition and a Sheet of the Cured Product Thereof 1 part by weight of a photoinitiator (product of Ciba Specialty Chemicals, D-1173) was added to 100 parts by weight of the mixture of the fluorene compounds obtained in (1) above, and an equivalent amount of toluene was added to the mixture, whereby a viscous liquid-like encapsulating resin composition was obtained. The obtained encapsulating resin composition was poured into a rectangular mold, vacuum dried, molded into a sheet-like shape, and irradiated with UV ray, to thereby obtain a sheet of the cured product.

The obtained sheet of cured product was evaluated as in Example 1. It was found that the refractive index of the cured product was greater than or equal to that of Comparative Example 1 and that the Shore-A hardness of the cured product was suppressed to 82.

Example 5

70 parts by weight of the mixture of the fluorene compounds obtained in (1) of Example 4 was mixed with 30 parts by weight of paracumylphenoxy acrylate (product of TOAGOSEI CO., LTD., product name: ARONIX M110, refractive index of monomer: 1.564) serving as the monofunctional acrylic-based monomer, but toluene was not added thereto. An encapsulating resin composition and a sheet of the cured product thereof were obtained and evaluated as in Example 1. Although this encapsulating resin composition had a slightly high viscosity, the composition can be used for injection and encapsulation. The cured product of this resin composition had a high refractive index of 1.612 and a Shore-A hardness of 80.

Example 6

In order of further reduce the viscosity and hardness of the sheet of the cured product of the encapsulating resin composition of Example 5, 60 parts by weight of paracumylphenoxy acrylate (product of TOAGOSEI CO., LTD., product name: ARONIX M110, refractive index of monomer: 1.564) serving as the monofunctional acrylic-based monomer was added to 40 parts by weight of the mixture of the fluorene compounds obtained in (1) of Example 4. Then, an encapsulating resin composition and a sheet of the cured product thereof were obtained and evaluated as in Example 1. The evaluation results showed that this encapsulating resin composition had a low viscosity of 5000 mPa·s. The cured product of this resin composition had a high refractive index of 1.58 or greater, and the Shore-A hardness was reduced to 70.

Example 7

In order to increase the cross-linking density to obtain a stiffer cured product, 60 parts by weight the mixture of the fluorene compounds obtained in (1) of Example 4 was mixed with 10 parts by weight of 9,9-bis(4-(2-acryloxyethoxy)phenyl)fluorene (product of Osaka Gas Chemicals Co., Ltd., product name: BPEF-A, refractive index: 1.6145) serving as the bifunctional acrylic-based monomer and 30 parts by weight of paracumylphenoxy acrylate (product of TOAGOSEI CO., LTD., product name: ARONIX M110, refractive index of monomer: 1.564) serving as the monofunctional acrylic-based monomer. Then, an encapsulating resin composition and a sheet of the cured product thereof were obtained and evaluated as in Example 1.

Example 8

In order to reduce the cross-linking density to obtain a more flexible cured product, 20 parts by weight the mixture of the fluorene compounds obtained in (1) of Example 4 was mixed with 30 parts by weight of paracumylphenoxy acrylate (product of TOAGOSEI CO., LTD., product name: ARONIX M110, refractive index of monomer: 1.564) serving as the monofunctional acrylic-based monomer and 50 parts by weight of the nonfunctional fluorene compound obtained in (1) of Example 1. Then, an encapsulating resin composition and a sheet of the cured product thereof were obtained and evaluated as in Example 1.

In this case, the Shore-A hardness of the cured product was reduced to 61 without reducing the refractive index.

Example 9

(1) Synthesis (B) of Mixture of Multifunctional, Monofunctional, and Nonfunctional Fluorene Compounds The same procedure as in the synthesis example in (1) of Example 4 was repeated except that the molar ratio of propionic acid to acrylic acid was 7:3, to thereby prepare a mixture of 9,9-bis(4-(2-acryloxyethoxy)phenyl)fluorene, 9-(4-(2-propionoylethoxy)phenyl)-9-(4-(2-acryloxyethoxy)phenyl) fluorene, and 9,9-bis(4-(2-propionoylethoxy)phenyl)fluorene. This mixture was a white powder. It was found from the results of FT-IR and liquid chromatography that the ratio of the bifunctional compound:the monofunctional compound: the nonfunctional compound in this mixture was 1:4:5.

(2) Manufacturing of Encapsulating Resin Composition and Sheet of Cured Product Thereof 30 parts by weight of paracumylphenoxy acrylate (product of TOAGOSEI CO., LTD., product name: ARONIX M110, refractive index of monomer: 1.564) serving as the monofunctional acrylic-based monomer was added to 70 parts by weight of the mixture of the fluorene compounds obtained in (1) above. Then, an encapsulating resin composition and a sheet of the cured product thereof were obtained and evaluated as in Example 1. This cured product had a high-refractive index of 1.607 and a Shore-A hardness of 72.

Example 10

(1) Synthesis (C) of Mixture of Multifunctional, Monofunctional, and Nonfunctional Fluorene Compounds The same procedure as in the synthesis example in (1) of Example 4 was repeated except that the molar ratio of propionic acid to acrylic acid was 9:1, to thereby prepare a mixture of 9,9-bis(4-(2-acryloxyethoxy)phenyl)fluorene, 9-(4-(2-propionoylethoxy)phenyl)-9-(4-(2-acryloxyethoxy)phenyl)fluorene, and 9,9-bis(4-(2-propionoylethoxy)phenyl)fluorene. This mixture was a white powder. It was found from the results of FT-IR and liquid chromatography that the ratio of the bifunctional compound:the monofunctional compound: the nonfunctional compound in this mixture was 0.1:1.9:8.

(2) Manufacturing of Encapsulating Resin Composition and Sheet of Cured Product Thereof 70 parts by weight of the mixture of the fluorene compounds obtained in (1) above was mixed with 5 parts by weight of 9,9-bis(4-(2-acryloxyethoxy)phenyl)fluorene (product of Osaka Gas Chemicals Co., Ltd., product name: BPEF-A, refractive index: 1.6145) serving as the bifunctional acrylic-based monomer and 25 parts by weight of paracumylphenoxy acrylate (product of TOAGOSEI CO., LTD., product name: ARONIX M110, refractive index of monomer: 1.564) serving as the monofunctional acrylic-based monomer. Then, an encapsulating resin composition and a sheet of the cured product thereof were obtained and evaluated as in Example 1. This cured product had a high-refractive index of 1.613 and a Shore-A hardness of 63.

The results of Examples 4 to 10 above are shown in Table 2.

TABLE 2

| | Composition (parts by weight) | | | | |
|---|---|---|---|---|---|
| | Mixed fluorene compound | High-refractive index (meth)acrylate-based monomer | | Nonfunctional fluorene | Curing |
| | (bifunctional:monofunctional:nonfunctional) | Multifunctional | Monofunctional | compound | agent |
| Ex. 4 | 100(25:50:25) (*6) | — | — | — | 1 |
| Ex. 5 | 70(17.5:35:17.5) (*6) | — | 30 (*3) | — | 1 |
| Ex. 6 | 40(10:20:10) (*6) | — | 60 (*3) | — | 1 |
| Ex. 7 | 60(15:30:15) (*6) | 10 (*1) | 30 (*3) | — | 1 |
| Ex. 8 | 20(5:10:5) (*6) | — | 30 (*3) | 50 (*5) | 1 |
| Ex. 9 | 70(7:28:35) (*7) | — | 30 (*3) | — | 1 |
| Ex. 10 | 70(0.7:13.3:56) (*8) | 5 (*1) | 25 (*3) | — | 1 |

| | Evaluation | | | | | |
|---|---|---|---|---|---|---|
| | Viscosity (mPa·s) | Refractive index of composition | Cut-off wavelength (nm) of composition | Refractive index of cured product | Hardness (Shore-A hardness) of cured product | Heat resistance of cured product |
| Ex. 4 | — | — | — | 1.628 | A82 | No change |
| Ex. 5 | 150000 | 1.5929 | — | 1.612 | A80 | No change |
| Ex. 6 | 5000 | 1.5763 | — | 1.584 | A70 | No change |
| Ex. 7 | 160000 | 1.5931 | — | 1.612 | A83 | No change |
| Ex. 8 | 150000 | 1.5917 | — | 1.599 | A61 | No change |
| Ex. 9 | 150000 | 1.5921 | — | 1.607 | A72 | No change |
| Ex. 10 | 180000 | 1.5945 | — | 1.613 | A63 | No change |

Notes:
(*1) 9,9-Bis(4-(2-acryloxyethoxy)phenyl)fluorene (product of Osaka Gas Chemicals Co., Ltd., product name: BPEF-A, refractive index: 1.6145).
(*3) Paracumylphenoxy acrylate (product of TOAGOSEI CO., LTD., product name: ARONIX M110, refractive index: 1.5542).
(*5) 9,9-Bis(4-(2-propionoylethoxy)phenyl)fluorene (synthesis example in (1) of Example 1, refractive index: 1.6073).
(*6) Mixture of fluorene compounds in (1) of Example 4.
(*7) Mixture of fluorene compounds in (1) of Example 9.
(*8) Mixture of fluorene compounds in (1) of Example 10.

Examples 11 to 13

2 or 4 g (20% or 40% by weight in terms of titania) of titania sol (solid content of titania: 20% by weight, medium: MEK, titania particle size: 5 to 15 nm, product of NIPPON SHOKUBAI CO., LTD.) was added to 2 g of the same monomer mixture as the encapsulating resin composition of Example 1 (i.e., a mixture of 10% by weight of 9,9-bis(4-(2-acryloxyethoxy)phenyl)fluorene (product of Osaka Gas Chemicals Co., Ltd., product name: BPEF-A, refractive index: 1.6145), 30% by weight of paracumylphenoxy acrylate (product of TOAGOSEI CO., LTD., product name: ARONIX M110, refractive index: 1.5542, and 60% by weight of 9,9-bis(4-(2-propionoylethoxy)phenyl)fluorene). Subsequently, MEK was removed in an evaporator, and a viscous resin composition containing titania nanoparticles was obtained. 1% by weight of a photoinitiator (product of Ciba Specialty Chemicals, D-1173) was added to this resin composition, to prepare an encapsulating resin composition of each of Examples 12 to 13. Similarly, the photoinitiator was added to a monomer mixture not containing the titania sol to give an encapsulating resin composition of Example 11. Each of the encapsulating resins was irradiated with UV light while being sandwiched between PET films, whereby a sheet of the cured product having a thickness of 0.5 mm was obtained. Each of the obtained encapsulating resin compositions and the sheet of each of the cured products were evaluated as in Example 1. The results are shown in Table 3.

A light-emitting device encapsulated with the resin composition of the present invention may be used in a wide variety of fields such as backlights of flat panels, traffic signals, lamps for advertising boards, and headlamps for automobiles.

The entire disclosure of the specification, claims and summary of Japanese Patent Application No. 2006-309635 filed on Nov. 15, 2006 is incorporated herein by reference.

What is claimed is:

1. A composition comprising
   a high-refractive index acrylic-based or methacrylic-based monomer having a refractive index of 1.55 or greater; and

TABLE 3

| | Composition (parts by weight) | | | | | Evaluation | | | |
|---|---|---|---|---|---|---|---|---|---|
| | High-refractive index (meth)acrylate-based monomer | | Nonfunctional fluorene compound | Titania (% by volume) | Curing agent | Refractive index of composition | Refractive index of cured product | Resistance to light (including UV light) | Resistance to light (not including UV light) | Heat resistance of cured product |
| | Multifunctional | Monofunctional | | | | | | | | |
| Ex. 11 | 10 (*1) | 30 (*3) | 60 (*5) | — | 1 | 1.586 | 1.595 | Slightly yellowed | No change | No change |
| Ex. 12 | 10 (*1) | 30 (*3) | 60 (*5) | 20 (4.7 vol %) | 1 | 1.614 | 1.630 | Yellowed | No change | No change |
| Ex. 13 | 10 (*1) | 30 (*3) | 60 (*5) | 40 (9.0 vol %) | 1 | 1.632 | 1.649 | Yellowed | No change | No change |

(*1) 9,9-Bis(4-(2-acryloxyethoxy)phenyl)fluorene (product of Osaka Gas Chemicals Co., Ltd., product name: BPEF-A, refractive index: 1.6145).

(*3) Paracumylphenoxy acrylate (product of TOAGOSEI CO., LTD., product name: ARONIX M110, refractive index: 1.5542).

(*5) 9,9-Bis(4-(2-propionoylethoxy)phenyl)fluorene (synthesis example of (1) in Example 1, refractive index: 1.6073).

Example 14

Each of the encapsulating resin compositions of Examples 11 to 13 in Table 3 was heated to 60° C. to lower the viscosity and poured into a transparent mold having a semi-spherical recess with a diameter of 5 mm. Subsequently, an LED chip base portion was place face down on the poured encapsulating resin composition such that a chip portion came into contact with the encapsulating resin composition, and the encapsulating resin composition was cured by applying UV spot light through the transparent mold with a total light dose of 1 J/cm². After being cooled to room temperature, the cured encapsulating resin composition was removed from the mold, to give an LED module having a transparent semi-spherical dome. The total light emission amounts of the obtained modules were measured using an integrating sphere and were found to be 37, 39, and 41 lumens, respectively. The total light emission amounts were found to be increased by 2.17, 2.29, and 2.41 times, respectively, with respect to a total light emission amount of the LED chip base portion itself of 17 lumens. Hence, it was shown that the light extracting efficiency of LEDs is significantly improved when the encapsulating resin composition of the present invention is used.

The resin composition of the present invention is useful as an optical curable resin composition for optically encapsulating LEDs, optical discs, and light-emitting devices such as lasers and is particularly useful as an encapsulating resin composition for use in high intensity LEDs.

a nonfunctional fluorene compound which is not polymerized along with the acrylic-based or methacrylic-based monomer;
wherein the high-refractive index acrylic-based or methacrylic-based monomer and the nonfunctional fluorene compound each have a 9,9-bisphenylfluorene skeleton.

2. The composition according to claim 1, wherein a cured product prepared by curing the composition has a refractive index of 1.57 or greater.

3. The composition according to claim 1, comprising ultrafine particles having a refractive index of 1.6 or greater.

4. A cured product prepared by curing a composition according to claim 1.

5. A light-emitting device encapsulated with a composition according to claim 1.

6. The composition according to claim 1, wherein the composition is free of any high-refractive index ultrafine particles.

7. The composition according to claim 1, wherein the composition comprises a diluting monomer having a viscosity of 1000 mPa·s or less.

8. The composition according to claim 1, wherein the composition further comprises a diluting monomer having a viscosity of 200 mPa·s or less.

9. The composition according to claim 1, wherein the acrylic-based or methacrylic-based monomer has a viscosity of 300,000 mPa·s or less.

* * * * *